United States Patent
Al Hafiz et al.

(10) Patent No.: US 10,771,041 B2
(45) Date of Patent: Sep. 8, 2020

(54) TUNABLE NARROW BANDPASS MEMS TECHNOLOGY FILTER USING AN ARCH BEAM MICRORESONATOR

(71) Applicant: KING ABDULLAH UNIVERSITY OF SCIENCE AND TECHNOLOGY, Thuwal (SA)

(72) Inventors: Md Abdullah Al Hafiz, Thuwal (SA); Mohammad Ibrahim Younis, Thuwal (SA); Lakshmoji Kosuru, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 15 days.

(21) Appl. No.: 16/318,220

(22) PCT Filed: Aug. 8, 2017

(86) PCT No.: PCT/IB2017/054845
§ 371 (c)(1),
(2) Date: Jan. 16, 2019

(87) PCT Pub. No.: WO2018/033828
PCT Pub. Date: Feb. 22, 2018

(65) Prior Publication Data
US 2019/0165757 A1    May 30, 2019

Related U.S. Application Data
(60) Provisional application No. 62/376,600, filed on Aug. 18, 2016.

(51) Int. Cl.
*H03H 9/02* (2006.01)
*H03H 9/24* (2006.01)
*H03H 9/46* (2006.01)

(52) U.S. Cl.
CPC .... *H03H 9/02409* (2013.01); *H03H 9/02393* (2013.01); *H03H 9/2447* (2013.01);
(Continued)

(58) Field of Classification Search
CPC ........... H03H 9/02409; H03H 9/02393; H03H 9/2447; H03H 9/2463; H03H 9/465;
(Continued)

(56) References Cited

U.S. PATENT DOCUMENTS

| 7,068,125 B2 | 6/2006 | Lutz et al. | |
| 2005/0195050 A1 | 9/2005 | Lutz et al. | |
| 2006/0152111 A1* | 7/2006 | Allison | H01G 5/18 310/328 |

FOREIGN PATENT DOCUMENTS

| CN | 101777882 | * 7/2010 | ............... B81B 7/02 |

OTHER PUBLICATIONS

Shen et al., "Design considerations for an acoustic MEMS filter", published in Microsystem Technologies 10, pp. 585-591, by Springer-Verlag. (Year: 2004).*

(Continued)

*Primary Examiner* — Benny T Lee
*Assistant Examiner* — Hafizur Rahman
(74) *Attorney, Agent, or Firm* — Patent Portfolio Builders PLLC (57) ABSTRACT

Embodiments of a tunable bandpass microelectromechanical (MEMS) filter are described. In one embodiment, such a filter includes a pair of arch beam microresonators, and a pair of voltage sources electrically coupled to apply a pair of adjustable voltage biases across respective ones of the pair of arch beam microresonators. The pair of voltage sources offer independent tuning of the bandwidth of the filter. Based on the structure and arrangement of the filter, it can be tunable by 125% or more by adjustment of the adjustable (Continued)

voltage bias. The filter also has a relatively low bandwidth distortion, can exhibit less than 2.5 dB passband ripple, and can exhibit sideband rejection in the range of at least 26 dB.

20 Claims, 9 Drawing Sheets

(52) U.S. Cl.
CPC .......... *H03H 9/2463* (2013.01); *H03H 9/465* (2013.01); *H03H 9/467* (2013.01); *H03H 2009/02173* (2013.01); *H03H 2009/02181* (2013.01)

(58) Field of Classification Search
CPC ......... H03H 9/467; H03H 2009/02173; H03H 2009/02181
USPC .......................................... 333/186
See application file for complete search history.

(56) References Cited

OTHER PUBLICATIONS

Giner, J., et al., "A Fully Integrated Programmable Dual-Band RF Filter Based on Electrically and Mechanically Coupled SMOS-MEMS Resonators," Journal of Micromechanics and Mocroengineering, Apr. 18, 2012, vol. 22.

Hajjaj, A.Z., et al., "Highly Tunable Electrothermally and Electrostatically Actuated Resonators," Journal of Microelectromechanical Systems, Jun. 2016, vol. 25, No. 3, pp. 440-449.

International Search Report in corresponding/related International Application No. PCT/IB2017/054845, dated Oct. 30, 2017.

Ouakad, H.M., "An Electrostatically Actuated MEMS Arch Band-Pass Filter," Shock and Vibration, Mar. 2, 2013, vol. 20, pp. 809-819.

Written Opinion of the International Searching Authority in corresponding/related International Application No. PCT/IB2017/054845, dated Oct. 30, 2017.

\* cited by examiner

TUNABLE NARROW BANDPASS MEMS TECHNOLOGY FILTER USING AN ARCH BEAM MICRORESONATOR

CROSS REFERENCE TO RELATED APPLICATIONS

This application is a U.S. National Stage of International Application No. PCT/IB2017/054845, filed on Aug. 8, 2017, which claims priority to, and the benefit of, U.S. provisional application entitled "Tunable Narrow Bandpass MEMS Technology Filter" having Ser. No. 62/376,600, filed Aug. 18, 2016, which are hereby incorporated by reference in their entirety.

BACKGROUND

Today, micro- and nano-scale devices or systems (e.g., microelectromechanical systems (MEMS) and nanoelectromechanical systems (NEMS)) can offer an attractive option in various applications. Tunable MEMS bandpass filters are in high demand in many applications, particularly in modern communication technology. The design of bandpass filters based on MEMS resonators has been the subject of research for some time. Typically, any given MEMS bandpass filter is designed to pass signals over a certain bandwidth (BW) about a center frequency ($f_C$).

SUMMARY

Aspects of the present disclosure are related to tunable narrow bandpass filters based upon microelectromechanical systems (MEMS) technology. The tunable narrow bandpass filters may be scaled down to sub-micron levels.

In one aspect, among others, a tunable bandpass microelectromechanical (MEMS) filter comprises at least one arch beam microresonator; a first voltage source electrically coupled to apply a static voltage bias to the arch beam microresonator; and a second voltage source electrically coupled to apply an adjustable voltage bias across the arch beam microresonator. In one or more aspects, a bandpass center frequency of the tunable bandpass MEMS filter can be tunable by at least 125% by adjustment of the adjustable voltage bias. The tunable bandpass MEMS filter can have a relatively low bandwidth distortion. The relatively low bandwidth distortion can be about ±50 Hz. In some aspects, the second voltage source can offer independent tuning of a passband of the tunable bandpass MEMS filter. A response of the tunable bandpass MEMS filter can exhibit less than 2.5 dB passband ripple. A response of the tunable bandpass MEMS filter can exhibit sideband rejection in a range of at least 26 dB. In various aspects, the tunable bandpass MEMS filter can further comprise at least one drive electrode adjacent to a first side of the at least one arch beam microresonator, wherein the at least one drive electrode is driven by an input signal. The tunable bandpass MEMS filter can further comprise at least one sense electrode adjacent to a second side of the at least one arch beam microresonator, the at least one sense electrode configured to provide at least one corresponding output signal. A differential amplifier can generate a filtered output from the at least one corresponding output signal.

In another aspect, a tunable bandpass microelectromechanical (MEMS) filter comprises a pair of arch beam microresonators; and a pair of voltage sources electrically coupled to apply a pair of adjustable voltage biases across respective ones of the pair of arch beam microresonators. In one or more aspects, a bandpass center frequency of the tunable bandpass MEMS filter can be tunable by at least 125% by adjustment of the adjustable voltage bias. The tunable bandpass MEMS filter can have a relatively low bandwidth distortion. The relatively low bandwidth distortion can be about ±50 Hz. In some aspects, the pair of voltage sources can offer independent tuning of a passband of the tunable bandpass MEMS filter. A response of the tunable bandpass MEMS filter can exhibit less than 2.5 dB passband ripple. A response of the tunable bandpass MEMS filter can exhibit sideband rejection in a range of at least 26 dB. In various aspects, the tunable bandpass MEMS filter can further comprise a pair of drive electrodes, each of the pair of drive electrodes adjacent to a corresponding one of the pair of arch beam microresonators, wherein the pair of drive electrodes is driven by an input signal. The tunable bandpass MEMS filter can further comprise a pair of sense electrodes, each of the pair of sense electrodes adjacent to a corresponding one of the pair of arch beam microresonators opposite the pair of drive electrodes, the pair of sense electrodes configured to provide a pair of output signals. A differential amplifier can be configured to generate a filtered output from the pair of output signals received from the pair of sense electrodes.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

For a more complete understanding of the embodiments described herein and the advantages thereof, reference is now made to the following description, in conjunction with the accompanying figures briefly described as follows.

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

DETAILED DESCRIPTION

As noted above, microelectromechanical systems (MEMS) and nanoelectromechanical systems (NEMS) offer an attractive option in various applications. Tunable MEMS bandpass filters are in high demand in many applications, particularly in modern communication technology. The design of bandpass filters based on MEMS resonators has been the subject of research for some time. Typically, any given MEMS bandpass filter is designed to pass signals over a certain bandwidth (BW) about a center frequency ($f_C$).

In many cases, it would be desirable to have some control over the bandwidth and center frequency of MEMS bandpass filters so the MEMS bandpass filters could be tailored to work in a variety of applications, to work with a variety of waveforms at different frequencies, to reduce thermal effects, and to compensate for manufacturing tolerances.

Narrow bandwidth MEMS bandpass filters are often realized through electrostatic or mechanical coupling of similar resonators. A major shortcoming of mechanical coupling of the resonators is the inability to tune the coupling between the resonators after fabrication. To circumvent this issue, many research groups have employed electrically coupled microresonators. An advantage of electrostatically tunable filters is that some tuning of the $f_C$ or the BW may be achieved by modifying the bias voltage of the resonators. However, changing the bias voltage of the resonators also modifies the amount of signal attenuation through the filter in addition to affecting the BW. Thus, the main challenges for design of tunable filters are the correlations that exist between the $f_C$, the BW, and bandpass attenuation (e.g., insertion loss) of such filters.

Figure 1:
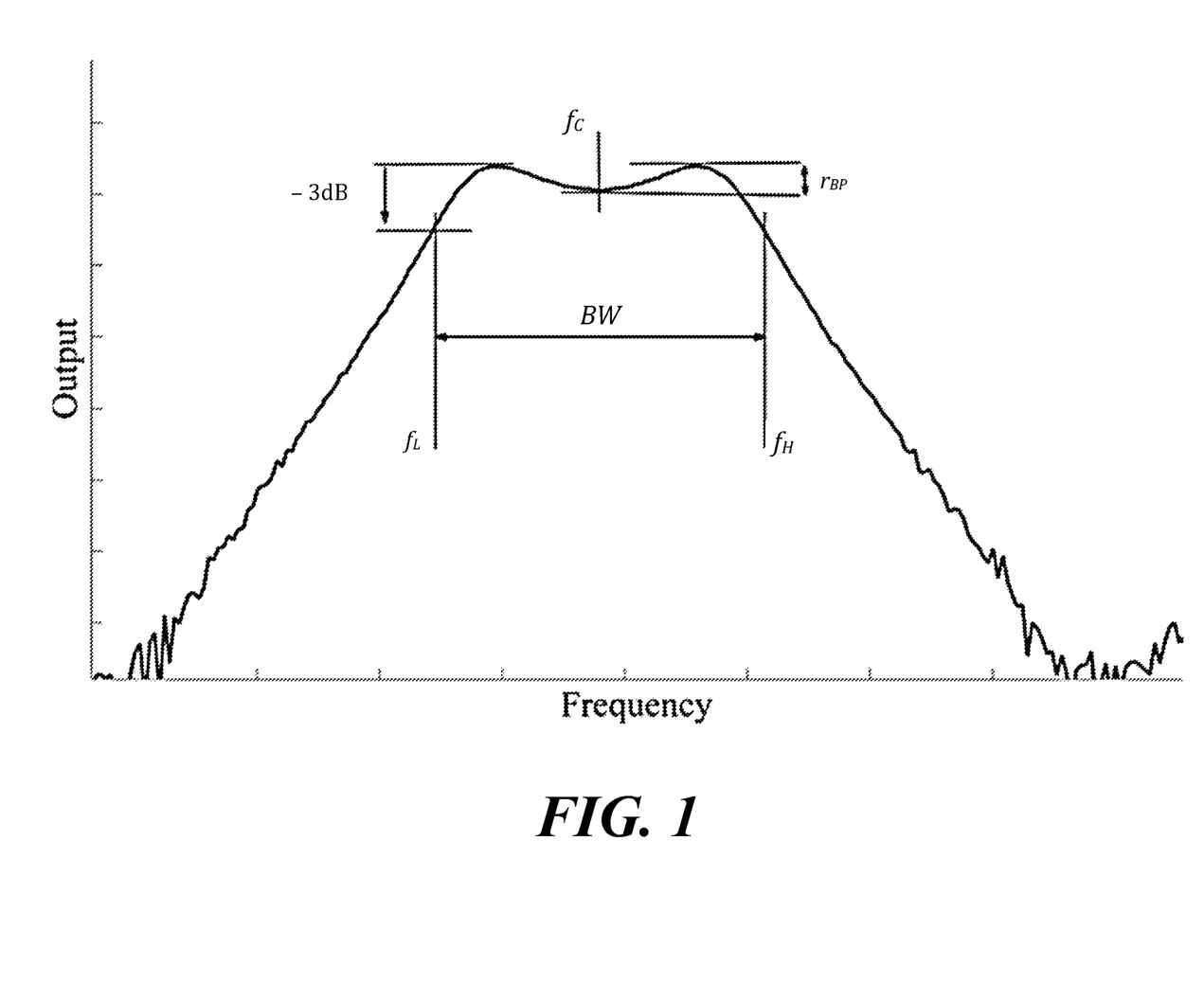
FIG. 1 illustrates various bandpass filter characteristics for discussion in connection with the embodiments described herein.
Figure 2:
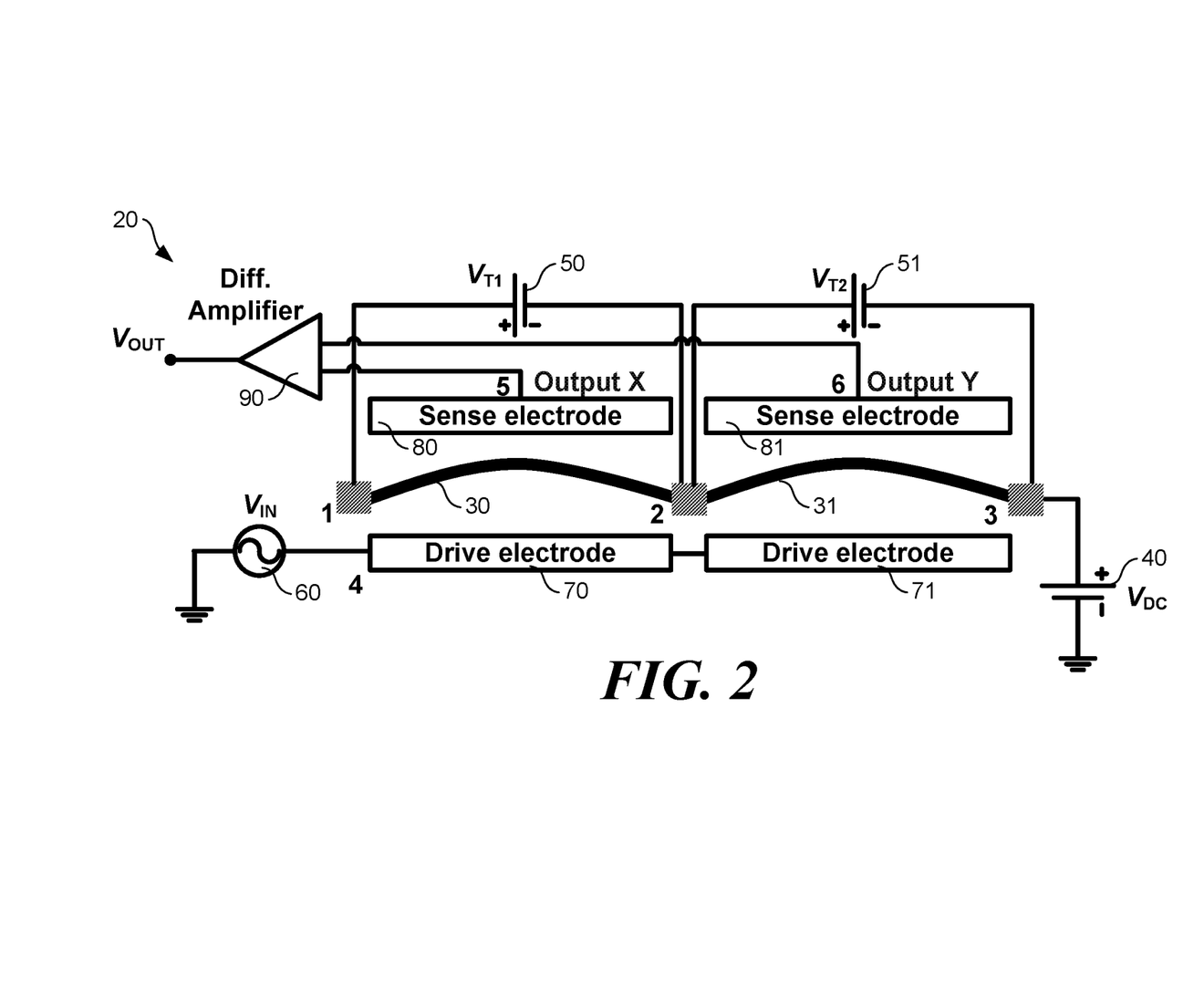
FIG. 2 illustrates an example of a tunable MEMS bandpass filter, according to the various embodiments described herein.

FIG. 1 illustrates various bandpass filter characteristics for discussion in connection with the embodiments described herein. Particularly, FIG. 1 shows the frequency response of a bandpass filter including bandwidth (BW), upper ($f_H$) and lower ($f_L$) corner frequencies, center frequency $f_C$, and bandpass ripple ($r_{BP}$). A novel MEMS bandpass filter design is described herein. The MEMS bandpass filter allows, for the first time, a very high degree of tunability of the $f_C$ (e.g., by more than 125%) with relatively little BW distortion (e.g., about ±50 Hz). In one example case, the bandpass filter has less than 2.5 dB passband ripple with sideband rejection (e.g., at least 26±4 dB). The design also has the provision for independent tuning of the BW at the expense of a slight increase in passband ripple. −3 dB Turning to the embodiments, FIG. 2 illustrates an example of a tunable MEMS bandpass filter 20 ("the bandpass filter 20"), according to the various embodiments described herein. The bandpass filter 20 includes two series-coupled arch beam microresonators 30 and 31, a DC voltage source 40 applied across the arch beam microresonators 30 and 31, and two voltage sources 50 and 51 each electrically coupled, respectively, to apply a voltage bias across the two arch beam microresonators 30 and 31. FIG. 2 also illustrates an input source 60 that provides a signal for filtration. The signal from the input source 60 is applied to the driving electrodes 70 and 71. As shown, the voltage sources 50 and 51 are connected across the arch beam microresonators 30 and 31, respectively, to independently modulate their corresponding resonance frequencies and create the tunable response of the bandpass filter 20. Thus, the voltage sources 50 and 51 are adjustable and can be varied in voltage, respectively, to adjust the operating characteristics of the bandpass filter 20. The outputs of the arch beam microresonators 31 and 32 are sensed by the sense electrodes 80 and 81, respectively, as shown in FIG. 2. The outputs of the sense electrodes 80 and 81 are fed into a low noise differential amplifier 90 to produce the filtered output of the bandpass filter 20.

The output of the differential amplifier 90 can be coupled to a network analyzer input port for $S_{21}$ transmission signal measurement. The voltage sources 50 and 51 are connected across the two arch beam microresonators 30 and 31, respectively to tune electrothermally the resonance frequency of each microresonator. The experiments described herein have been conducted at 2 Torr pressure and at room temperature with the following preset conditions: $V_{DC}$=50V, $V_{AC}$=(−) 25 dBm (0.0125 $V_{rms}$). The resonance frequencies of the two arch beam microresonators 31 and 32 were 117 kHz and 119 kHz, respectively, and the common mode differential configuration (i.e., common output from phase inversion of two output signals) was used to obtain the filter response. The phase response of the arch beam microresonators 31 and 32 did not show a complete 360° phase transition at the center of the frequency response, and no filter characteristics were shown by the arch beam microresonators 31 and 32 when they were not electrothermally tuned.

The bandpass filter 20 can be fabricated in any suitable way. In one case, the arch beam resonators are fabricated on a highly conductive silicon (Si) device layer of silicon-on-insulator (SOI) wafer by a two-mask process using standard photo-lithography, electron-beam (E-beam) evaporation for metal layer deposition, deep reactive ion etch (DRIE) for silicon device layer etching, and vapor hydrofluoric (HF) etch to remove the oxide layer underneath of the resonating structure. Thus, the bandpass filter 20 consists of clamped-clamped arch shaped beams with two adjacent electrodes, one drive (or actuating) electrode to electrostatically drive it into in-plane motion and another sense electrode to detect the generated AC output current. The dimensions of the arch beams are 500 µm in length, 3 µm in width, and 30 µm (Si device layer of SOI wafer) in thickness, but other thicknesses can be used. The gap between the drive (or actuating) electrode and the resonating beam is 8 µm at the clamped ends and 11 µm at the mid-point of the micro-beam due to its 3 µm initial curvature. The fabrication process is controllable and reproducible with minimal constrains from residual stress.

Figure 3A:
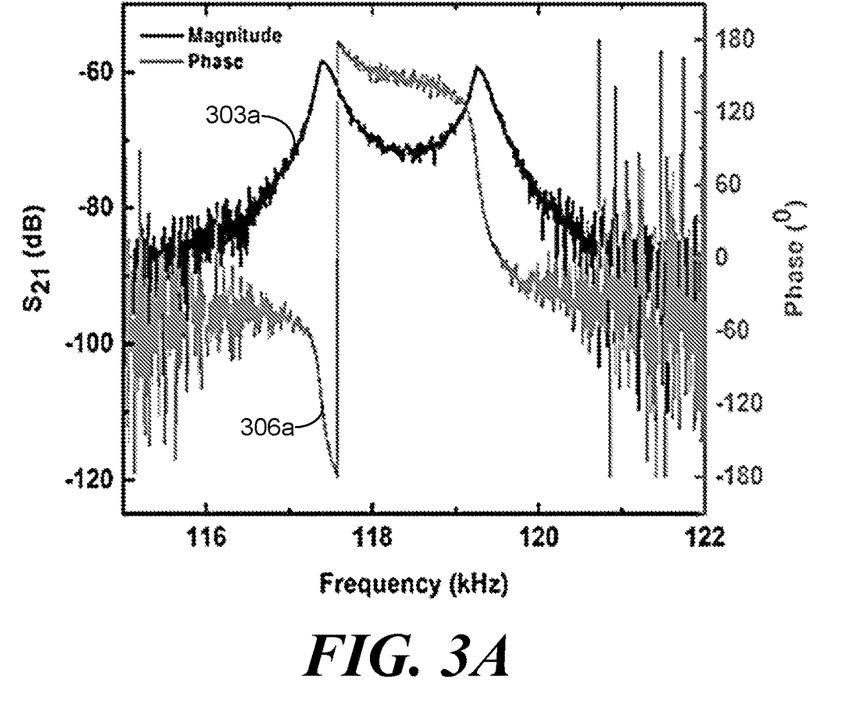
FIG. 3A illustrates an example of a response of the bandpass filter shown in FIG. 2 without tuning, according to the various embodiments described herein.
Figure 3B:
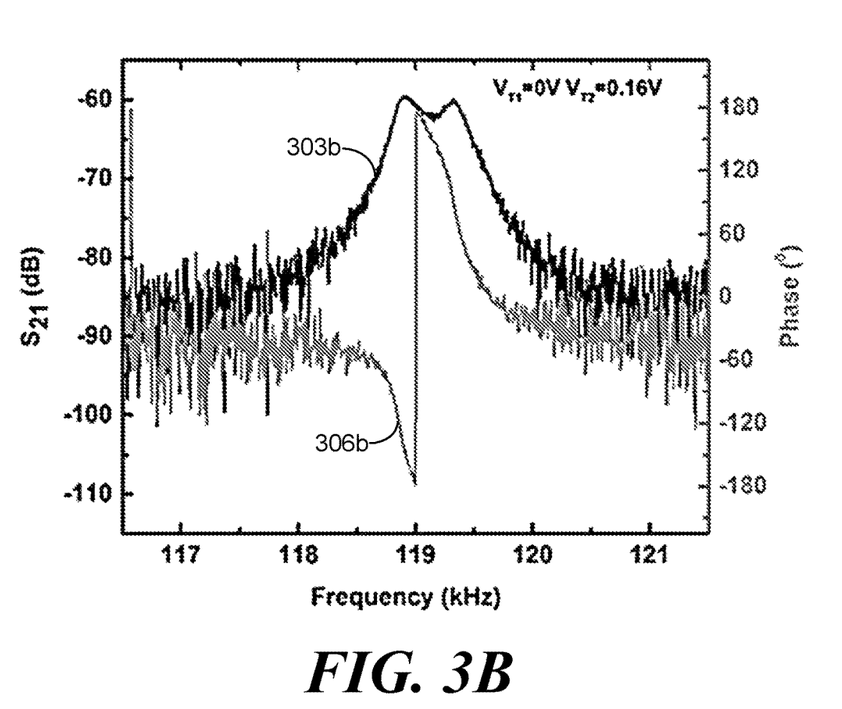
FIGS. 3B and 3C illustrate example responses of the bandpass filter shown in FIG. 2 with tuning, according to the various embodiments described herein.

Turning to the response of the bandpass filter 20, FIG. 3A illustrates an example response of the bandpass filter 20 without tuning, and FIG. 3B illustrates an example response of the bandpass filter 20 with tuning. In FIG. 3A, the magnitude (303a) and phase (306a) response of the bandpass filter 20 is shown when the voltage sources 50 and 51 are both set to 0V. With the voltage sources 50 and 51 both set to 0V, the bandpass filter 20 is not being tuned. In contrast, FIG. 3B, the magnitude (303b) and phase (306b) response of the bandpass filter 20 is being tuned with the voltage sources 50 and 51 set to 0V and 0.16V, respectively. As for the response exhibited in FIG. 3B, the insertion loss (IL)=−59.7 dB, the center frequency $f_C$=119.15 kHz, the passband ripple $r_{PB}$=2.3 dB, the 3 dB bandwidth $BW_{3dB}$=591 Hz, and the sideband rejection $SB_{rej}$=23.09 dB. Comparing the non-tuned and tuned responses of the bandpass filter 20 (i.e., comparing the response shown in FIG. 3A to that shown in FIG. 3B), it is clear that the application of voltage biases using the voltage sources 50 and 51 can be used to tune the bandpass filter 20 to have narrower BW, lower passband ripple $r_{PB}$, and improved 3 dB bandwidth $BW_{3dB}$, among other tuned parameters or characteristics.

Figure 3C:
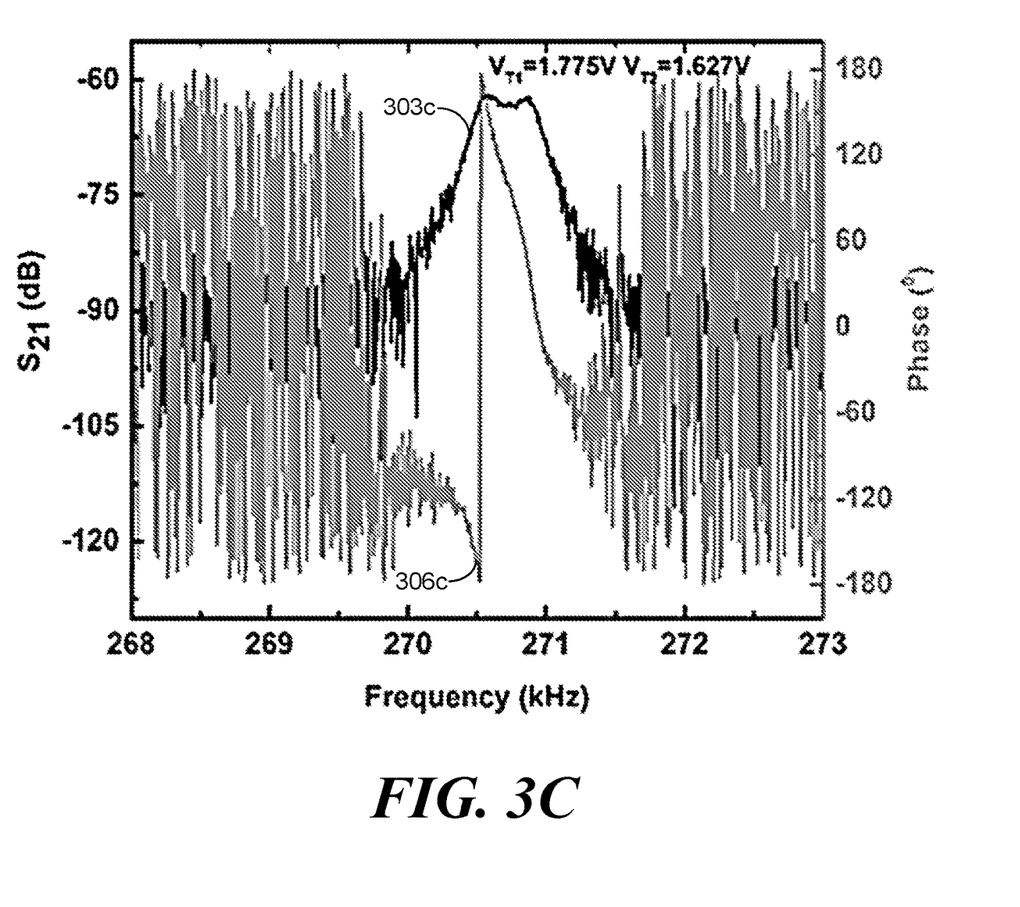

FIG. 3C illustrates another example response of the bandpass filter shown in FIG. 2 with tuning according to the embodiments described herein. In FIG. 3C, the magnitude (303c) and phase (306c) response of the bandpass filter 20 is being tuned with the voltage sources 50 and 51 set to 1.775V and 1.627V, respectively. In that case, the center frequency is tuned to $f_C$=270.72 kHz from the initial value of 119.15 kHz (125% of the initial $f_C$), the IL=−62.3 dB, the passband ripple $r_{PB}$=0.93 dB, the 3 dB bandwidth $BW_{3dB}$=505 Hz, and the sideband rejection $SB_{rej}$=29.2 dB.

Figure 4A:
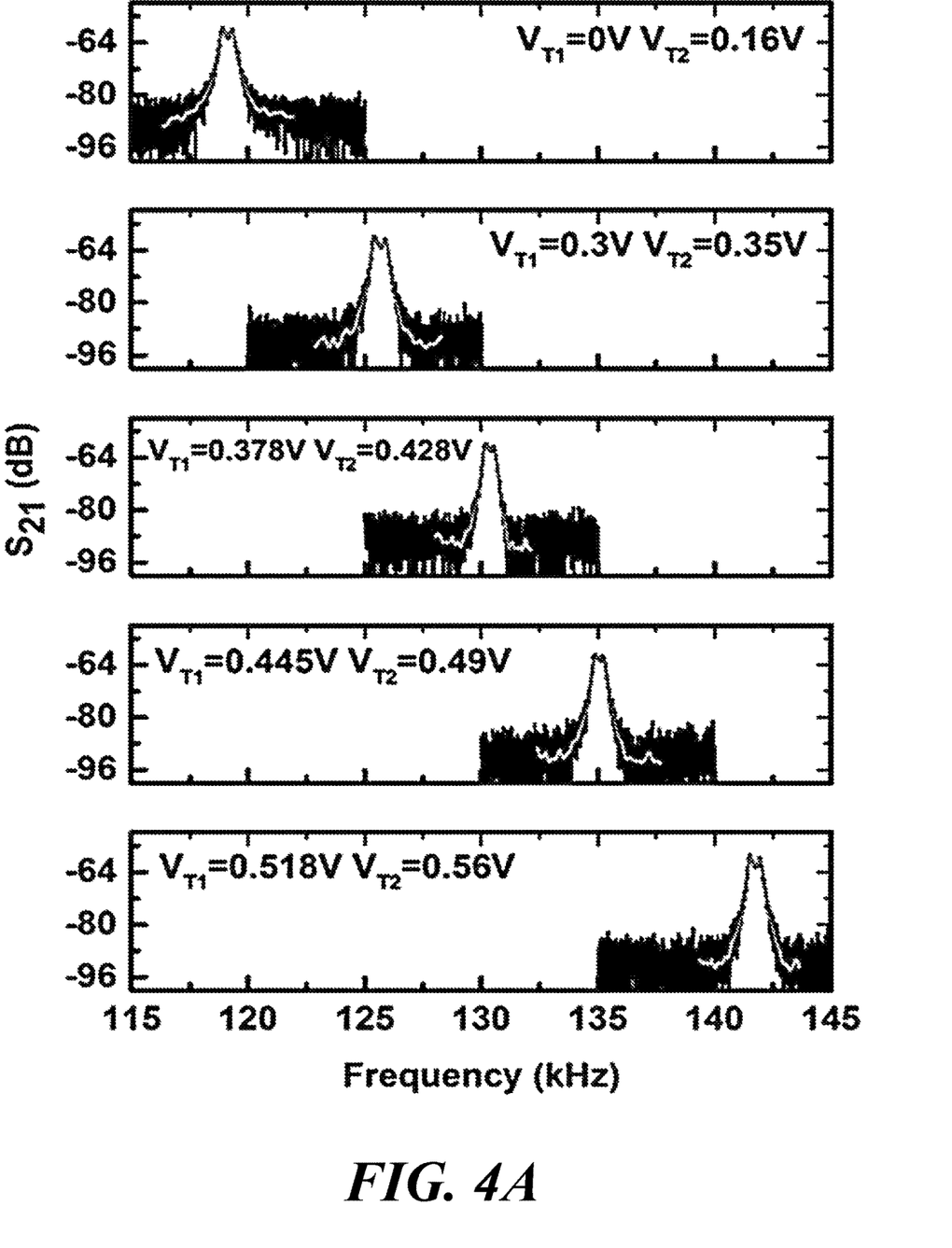
FIGS. 4A-4D illustrate the tunability of the center frequency of the bandpass filter shown in FIG. 2, according to the various embodiments described herein.
Figure 4B:
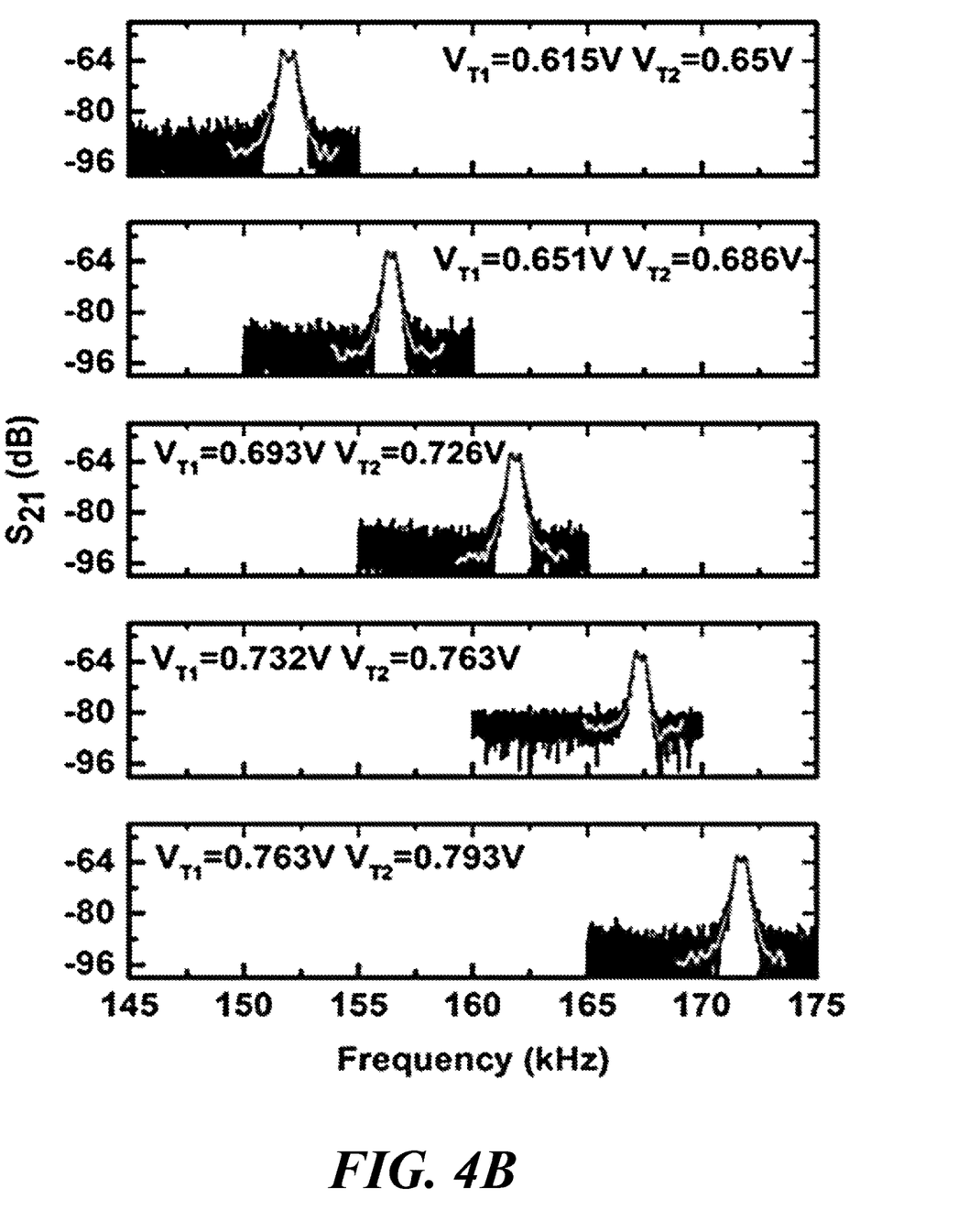
Figure 4C:
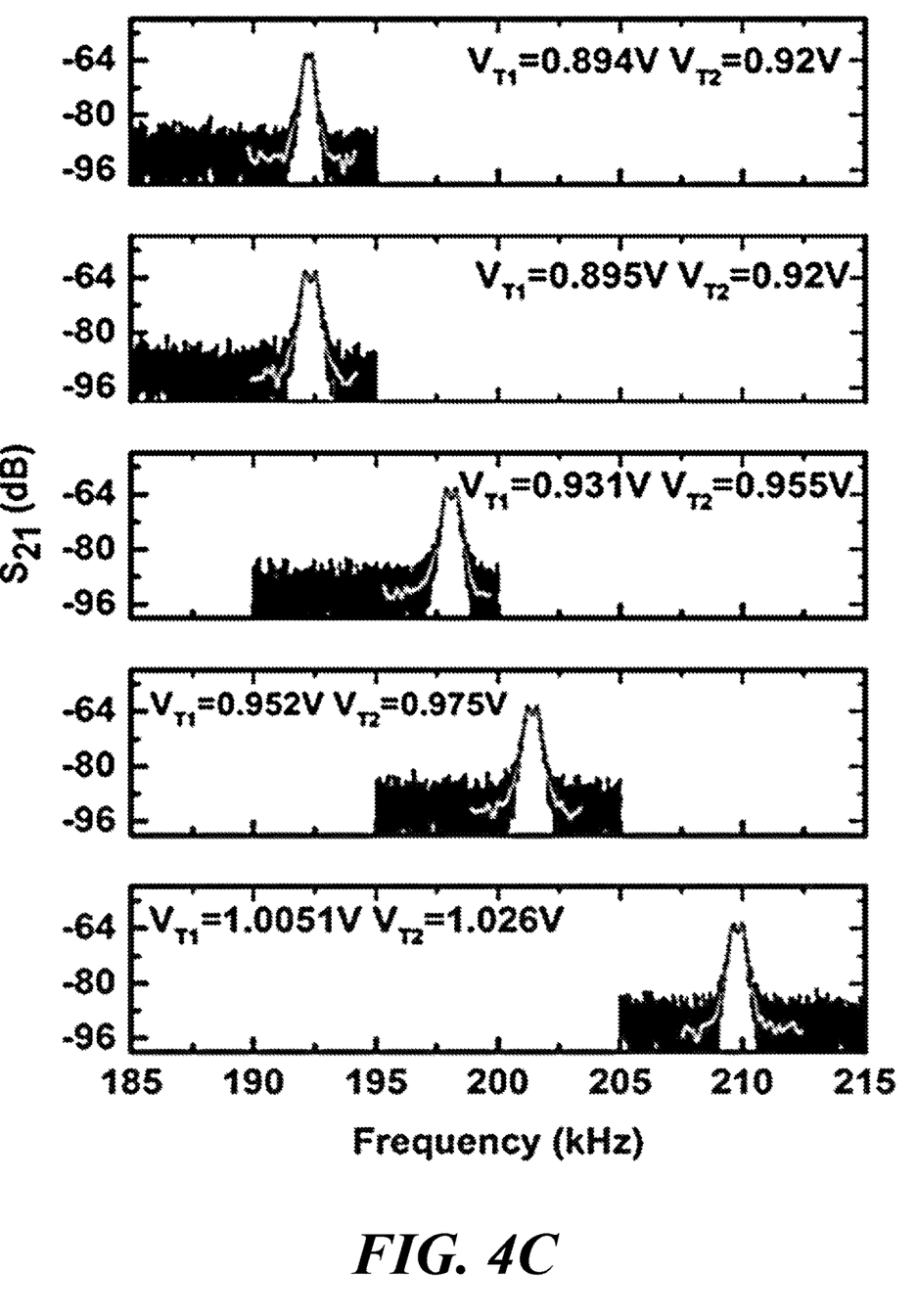
Figure 4D:
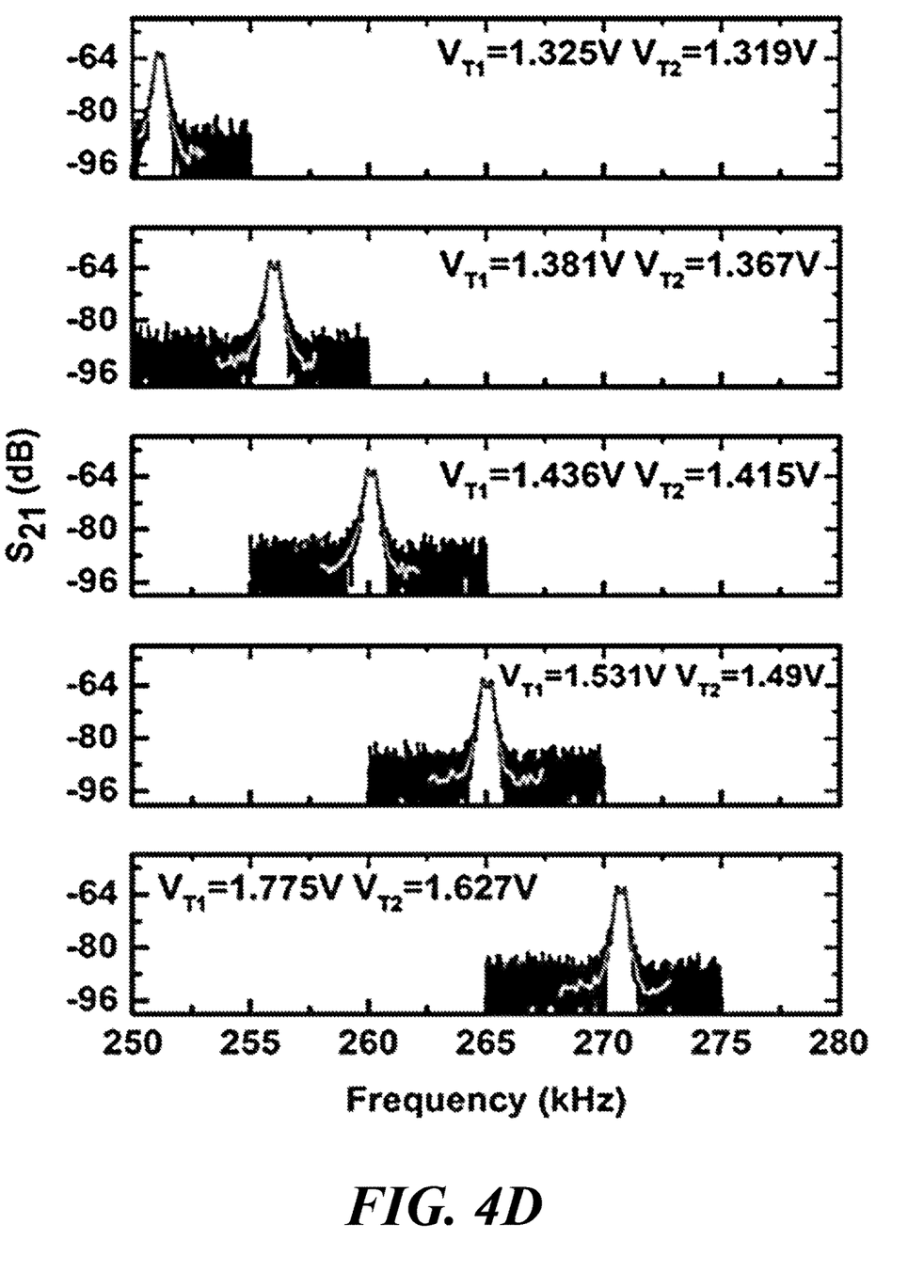

In extension to the results shown in FIGS. 3B and 3C, FIGS. 4A-4D illustrate the tunability of the center frequency of the bandpass filter 20 for different voltage biases using the voltage sources 50 and 51. As shown in FIGS. 4A-4D, the center frequency $f_C$ of the bandpass filter 20 is tuned from 115 kHz to 270 kHz using the voltage sources 50 and 51. Particularly, FIG. 4A shows the tunability of the center frequency $f_C$ of the bandpass filter 20 between 115 kHz to 145 kHz, FIG. 4B shows the tunability of the center frequency $f_C$ of the bandpass filter 20 between 145 kHz to 175 kHz, FIG. 4C shows the tunability of the center frequency $f_C$ of the bandpass filter 20 between 185 kHz to 215 kHz, and FIG. 4D shows the tunability of the center frequency $f_C$ of the bandpass filter 20 between 250 kHz to 280 kHz. Table 1, below, shows further examples of how various characteristics of the bandpass filter 20 can change for different voltage biases using the voltage sources 50 and 51. The results presented in Table 1 show the large tuning of center frequency of about 125% with nearly constant bandwidth for the proposed device.

TABLE 1

| $V_{T1}$ (V) | $V_{T2}$ (V) | Center Frequency, $f_C$ (kHz) | Bandwidth $BW_{3dB}$ (Hz) | Ripple (dB) | Side Band Rejection, $SB_{rej}$ (dB) | Insertion Loss, IL (dB) |
|---|---|---|---|---|---|---|
| 0 | 0.16 | 119.1535 | 591.65 | 2.29 | 23.09 | −59.7 |
| 0.09 | 0.19 | 119.751 | 509.808 | 1.114 | 27.62 | −59.76 |
| 0.2 | 0.265 | 121.933 | 528.4 | 1.257 | 24.79 | −59.793 |
| 0.32 | 0.37 | 126.684 | 550.19 | 1.8067 | 29.99 | −60.33 |
| 0.425 | 0.47 | 133.514 | 592.86 | 2.44 | 26.847 | −60.23 |
| 0.528 | 0.57 | 142.7409 | 507.76 | 2.08 | 31.45 | −59.359 |
| 0.732 | 0.763 | 167.312 | 532.35 | 1.79 | 20.814 | −61.307 |
| 0.842 | 0.87 | 184.277 | 425.8 | 0.596 | 31.15 | −62.085 |
| 0.942 | 0.966 | 199.834 | 419.69 | 0.165 | 28.76 | −62.58 |
| 1.097 | 1.114 | 224.114 | 573.63 | 1.17 | 26.13 | −63.058 |
| 1.251 | 1.251 | 243.351 | 493.2 | 1.079 | 27.61 | −62.392 |
| 1.402 | 1.386 | 257.694 | 505.4 | 1.33 | 28.21 | −62.7 |
| 1.5051 | 1.471 | 263.939 | 494.8 | 1.375 | 28.13 | −62.536 |
| 1.598 | 1.537 | 267.605 | 521.6 | 2.019 | 29 | −62.066 |
| 1.627 | 1.557 | 268.372 | 438.4 | 1.323 | 28.2 | −61.808 |
| 1.682 | 1.587 | 269.528 | 494.2 | 1.88 | 29.02 | −61.977 |
| 1.775 | 1.627 | 270.72 | 461.86 | 0.932 | 29.27 | −62.3002 |

Figure 5:
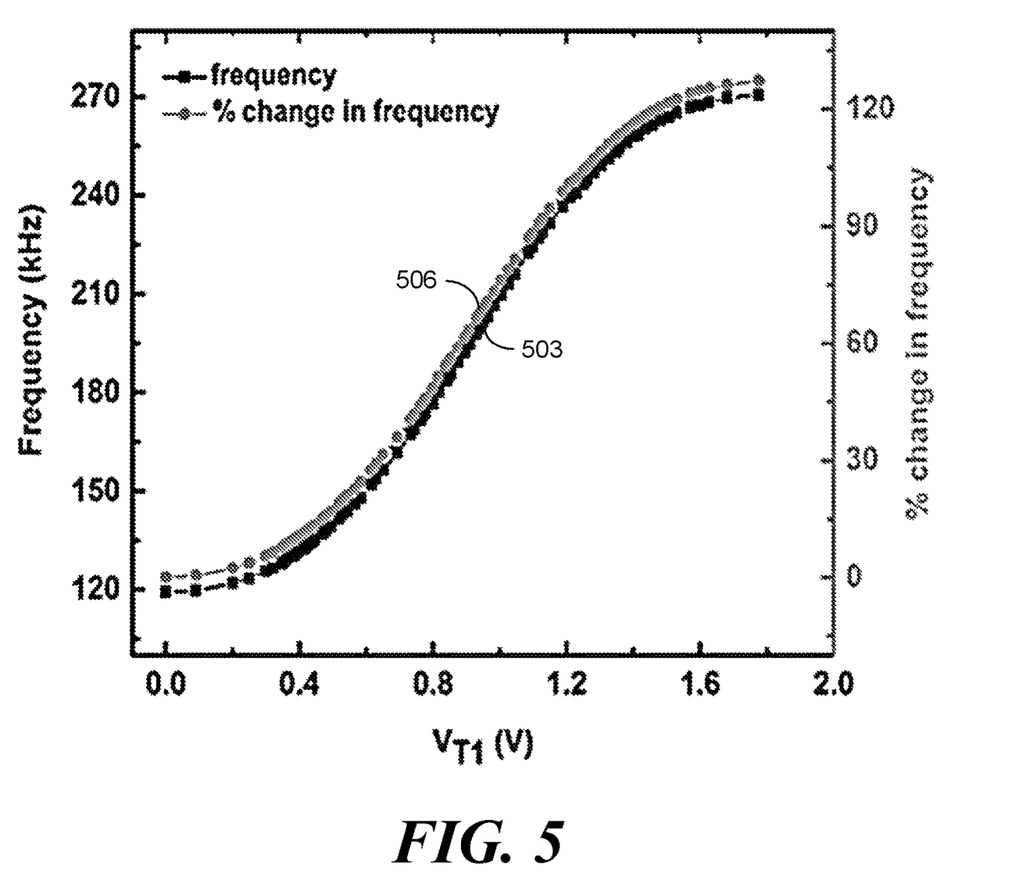
FIG. 5 illustrates variation in center frequency and percentage of tuning the center frequency of the bandpass filter shown in FIG. 2 according to electrothermal voltage ($V_{T1}$), according to the various embodiments described herein.

FIG. 5 illustrates an example of the variation in center frequency (503) and percentage of tuning the center frequency (506) of the bandpass filter shown in FIG. 2 according to electrothermal voltage ($V_{T1}$), according to the embodiments described herein. FIG. 5 clearly shows that the MEMS bandpass filter shown in FIG. 2 allows a very high degree of tunability of the $f_C$ (e.g., by more than 125%) based on $V_{T1}$.

The proposed device resonators can be easily scaled down to sub-micron levels with standard fabrication processes and high frequency regime can be radially accessed. The frequency tuning method demonstrated herein would be equally applicable for sub-micron scale devices with possible increases on the voltage load depending on the required level of frequency tuning and resistance of the mechanical structure to DC currents.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

At least the following is claimed:

1. A tunable bandpass microelectromechanical (MEMS) filter, comprising:
   at least one arch beam microresonator;
   a first voltage source electrically coupled to a first end of the at least one arch beam to apply a static voltage bias to the arch beam microresonator; and
   a second voltage source electrically coupled to both the first end and a second end of the at least one arch beam microresonator to apply an adjustable voltage bias across the arch beam microresonator.

2. The tunable bandpass MEMS filter according to claim 1, wherein a bandpass center frequency of the tunable bandpass MEMS filter is tunable by at least 125% of the bandpass center frequency by adjustment of the adjustable voltage bias.

3. The tunable bandpass MEMS filter according to claim 1, wherein the tunable bandpass MEMS filter has a relatively low bandwidth distortion.

4. The tunable bandpass MEMS filter according to claim 3, wherein the relatively low bandwidth distortion is about ±50 Hz.

5. The tunable bandpass MEMS filter according to claim 1, wherein the second voltage source offers independent tuning of a passband of the tunable bandpass MEMS filter.

6. The tunable bandpass MEMS filter according to claim 1, wherein a response of the tunable bandpass MEMS filter exhibits less than 2.5 dB passband ripple.

7. The tunable bandpass MEMS filter according to claim 1, wherein a response of the tunable bandpass MEMS filter exhibits sideband rejection in a range of at least 26 dB.

8. The tunable bandpass MEMS filter according to claim 1, further comprising at least one drive electrode adjacent to a first side of the at least one arch beam microresonator, wherein the at least one drive electrode is driven by an input signal.

9. The tunable bandpass MEMS filter according to claim 8, further comprising at least one sense electrode adjacent to a second side of the at least one arch beam microresonator, the at least one sense electrode configured to provide at least one corresponding output signal.

10. The tunable bandpass MEMS filter according to claim 9, wherein a differential amplifier generates a filtered output from the at least one corresponding output signal.

11. A tunable bandpass microelectromechanical (MEMS) filter, comprising:
    first and second arch beam microresonators electrically connected in series;
    a first voltage source that is electrically coupled to opposite ends of the first arch beam microresonator to apply a first adjustable voltage bias across the first arch beam microresonator;
    a second voltage source that is electrically coupled to opposite ends of the second arch beam microresonator to apply a second adjustable voltage bias across the second arch beam microresonator; and
    a third voltage source electrically coupled to a first end of the first arch beam to apply a static voltage bias to the first arch beam microresonator.

12. The tunable bandpass MEMS filter according to claim 11, wherein a bandpass center frequency of the tunable bandpass MEMS filter is tunable by at least 125% of the bandpass center frequency by adjustment of the adjustable voltage bias.

13. The tunable bandpass MEMS filter according to claim 11, wherein the tunable bandpass MEMS filter has a relatively low bandwidth distortion.

14. The tunable bandpass MEMS filter according to claim 13, wherein the relatively low bandwidth distortion is about ±50 Hz.

15. The tunable bandpass MEMS filter according to claim 11, wherein the first and second voltage sources offer independent tuning of a passband of the tunable bandpass MEMS filter.

16. The tunable bandpass MEMS filter according to claim 11, wherein a response of the tunable bandpass MEMS filter exhibits less than 2.5 dB passband ripple.

17. The tunable bandpass MEMS filter according to claim 11, wherein a response of the tunable bandpass MEMS filter exhibits sideband rejection in a range of at least 26 dB.

18. The tunable bandpass MEMS filter according to claim 11, further comprising a pair of drive electrodes, each of the pair of drive electrodes adjacent to a corresponding one of the first and second arch beam microresonators, wherein the pair of drive electrodes is driven by an input signal.

19. The tunable bandpass MEMS filter according to claim 18, further comprising a pair of sense electrodes, each of the pair of sense electrodes adjacent to a corresponding one of the first and second arch beam microresonators, opposite to the pair of drive electrodes, the pair of sense electrodes configured to provide a pair of output signals.

20. The tunable bandpass MEMS filter according to claim 19, wherein a differential amplifier is configured to generate a filtered output from the pair of output signals received from the pair of sense electrodes.

* * * * *